United States Patent
Tung

[11] Patent Number: 6,133,606
[45] Date of Patent: Oct. 17, 2000

[54] HIGH VOLTAGE COMPLEMENTARY SEMICONDUCTOR DEVICE (HV-CMOS) WITH GRADIENT DOPING ELECTRODES

[75] Inventor: Ming-Tsung Tung, Hsin-Chu, Taiwan

[73] Assignee: United Microelectronics Corp., Hsin-Chu, Taiwan

[21] Appl. No.: 09/310,239

[22] Filed: May 12, 1999

[51] Int. Cl.[7] .................................... H01L 21/265
[52] U.S. Cl. .................. 257/332; 257/333; 257/389; 257/900
[58] Field of Search ..................... 257/330, 332, 257/333, 334, 339, 389, 900; 438/272, 271, 270

[56] References Cited

U.S. PATENT DOCUMENTS

| | | | |
|---|---|---|---|
| 4,830,975 | 5/1989 | Bovaird et al. | 437/41 |
| 5,559,357 | 9/1996 | Krivokapic | 257/336 |
| 5,736,435 | 4/1998 | Venkatesan et al. | 438/151 |
| 5,888,880 | 3/1999 | Gardner et al. | 438/424 |
| 5,937,297 | 8/1999 | Peidous | 438/270 |
| 5,962,894 | 10/1999 | Gardner et al. | 257/330 |
| 5,972,754 | 10/1999 | Ni et al. | 438/270 |

*Primary Examiner*—Donald L. Monin, Jr.
*Attorney, Agent, or Firm*—Harness, Dickey & Pierce, P.L.C.

[57] ABSTRACT

A structure of high voltage semiconductor devices having N-well 1 and N-well 2 formed with two different doping densities acting as a gradient doping of a drift region. This structure results in a lift in its current drive capability and as well as in its breakdown voltage. The structure further comprises a buried spacer oxide, serving as a point of exertion for the edges of the buried gate electrode. And finally, since the gate electrode is formed by a trenching method, not only is the channel length increased with the placement of both the channel and drift regions changes in the to vertical direction, all of those contribute to a great reduction in the occupied chip area.

13 Claims, 4 Drawing Sheets

100

101
100

110

100

HIGH VOLTAGE COMPLEMENTARY SEMICONDUCTOR DEVICE (HV-CMOS) WITH GRADIENT DOPING ELECTRODES

BACKGROUND OF THE INVENTION

1. Field of the Invention

The present invention relates to a structure of semiconductor devices, and more particularly relates to a structure having an enhancement in high current drive capability and a diminishment in the area occupied by devices.

2. Description of the Prior Art

Integrated circuits (ICs) are gradually stepping toward highly dense targets in order to comply with developments and changes in time and technology. The trend is toward gradual diminishment in semiconductor device sizes and distances between devices. Therefore, even though the sizes of semiconductor devices are being reduced to a measuring unit that is as small as angstroms, it is still very important to maintain the best operating condition within the devices. In particular, it is necessary to require little effort in achieving high current drive capability under high voltage operations. Conventional structures of high voltage CMOS (HV-CMOS) devices have channels and drift regions in the horizontal direction, which result in a larger chip area occupation. Therefore, a better and more advanced device structure is needed urgently.

FIG. 1 shows a cross-sectional view of a structure of a conventional CMOS transistor. The structure comprises a p-type conductivity substrate 10, a N+ source electrode 11, a N+ drain electrode 12, a drift region 13, a field oxide (FOX) layer 14, a gate oxide layer 15, and a gate electrode 16.

In the structure of a conventional CMOS transistor described above, channel and drift regions are all in the horizontal direction and only source and drain electrodes are located inside the substrate. This type of structure makes channel and drift regions of the CMOS seems shorter in length. When the channel of the CMOS device is reduced in length, hot carrier effects would become more serious. And yet, there are many ways of solving hot carrier effects for short channel length CMOS devices. The simplest method would be to reduce the CMOS transistor's operating voltage. For example, given a 5V reduced to 3.3V or even 2.5V, such a reduction would reduce the channel's horizontal electric field and would result in an inability to form any hot carrier. Although the phenomena of "carrier multiples" can be greatly reduced, the device would not be able to be used for high voltage operations. If there is a desire to avoid reducing the operating voltage for CMOS transistors and also solving hot carrier effects for short channel length CMOS devices, then the channel length of CMOS devices needs to be increased. The structure in horizontal direction and an increase in the channel length would occupy a greater chip area, which is against the trend of gradual diminishment in the sizes of semiconductor devices.

Another method that is popular for use in solving hot carrier effects for short channel length CMOS devices is placing a N⁻ type region with lower doping density at the place where the source/drain region draws near the channel. This kind of design has been called —"Lightly Doped Drain", or its initial LDD. The use of LDD is not a perfect solution. First of all, LDD makes CMOS fabrication more complicated. Next, due to lower doping density of LDD, the series resistance between source and drain would be higher, causing a reduction in the device's operating speed and an increment in power dissipation.

Furthermore, due to lower doping density under the gate oxide layer, the resistance also goes higher and results in a weaker current drive capability. The structure of source and drain region is symmetrical and both sides have low doping density. The overall current drive capability would be even weaker. And finally, this kind of transistor structure would easily form parasitic bipolar effects under high voltages.

SUMMARY OF THE INVENTION

In accordance with the above description in the prior art, conventional high voltage device structures have a number of disadvantages. The main objective of the present invention is to provide a high voltage semiconductor device structure having two different doping densities as the gradient doping for the drift regions that substantially enhance the device's current drive capability and its breakdown voltage. In addition, it is desired to form spacer oxides to act as the point of exertion for the edges of the polysilicon gate in avoiding breakdown voltage to occur in advance. Moreover, changing the geometrical placement of device's channel and drift regions from the conventional horizontal direction to a vertical direction, which results in a great reduction in the occupied chip area.

The present invention relates to a structure of a transistor device, where this special structure comprises, as shown in FIG. 2A, a p-type semiconductor substrate 100, wherein is formed a first trench 140 and a second trench 170 within the first trench. The depth of the second trench is deeper than the first trench. Next, a pair of source (200, 130, and 120) and drain (210, 131, and 121) regions are formed just beside the first trench 140 and the second trench 170. Moreover, the pair of source and drain region is formed within the substrate 100 and have a depth approximately equal to the depth of the second trench 170.

Within the pair of source and drain regions, there is formed a first doping region 120 and 121. Also, within the same pair of source and drain regions, there is formed a second doping region 130 and 131 that is directly above the first doping region. The pair of source and drain regions is not completed without the formation of a third doping region 200 and 210, which is directly above the second doping region. Moreover, the top surface of the third doping region is the uppermost surface of the pair of source and drain regions.

The device structure further comprises a spacer 160 formed on top of a sidewall of the first trench 140, and also occupies a portion of the bottom of the first trench. A gate oxide layer 180 formed on top of both sidewalls and the bottom surface of the second trench 170. Finally, a buried gate electrode formed on top of the gate oxide layer and also fills up both the first trench and the second trench.

The special structure of the present invention mentioned above comprises the following advantages. First of all, using trenching method to place a gate electrode and spacers and also changing the geometrical placement of device's channel and drift regions from horizontal direction to vertical direction, all of those make contributions to a great reduction in the occupied chip area.

Secondly, the channel length increases in accompanied by the formation of the gate electrode by trenching method. The shape of the channel changes from the conventional "straight line" type to a "U"-type shape. Hot carrier effects would be reduced in a great proportion due to this increment in the channel length.

Thirdly, in the field of source/drain doping density, if the first doping region and the second doping region have the same doping density and both are low, the device is capable of handling high voltages but its current drive capability is weaker. If the first doping region and the second doping region have same doping density and both are high, the device is not capable of handling high voltages but its current drive capability is stronger. Therefore, the present invention uses different doping densities, from low to high, to form a complementary structure in solving the above defects and also lifting the breakdown voltage.

Finally, the placement of spacers in the present invention can avoid breakdown voltage to occur in advance, that is to make sure that topper layers will not breakdown before lower layers.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Figure 1A:
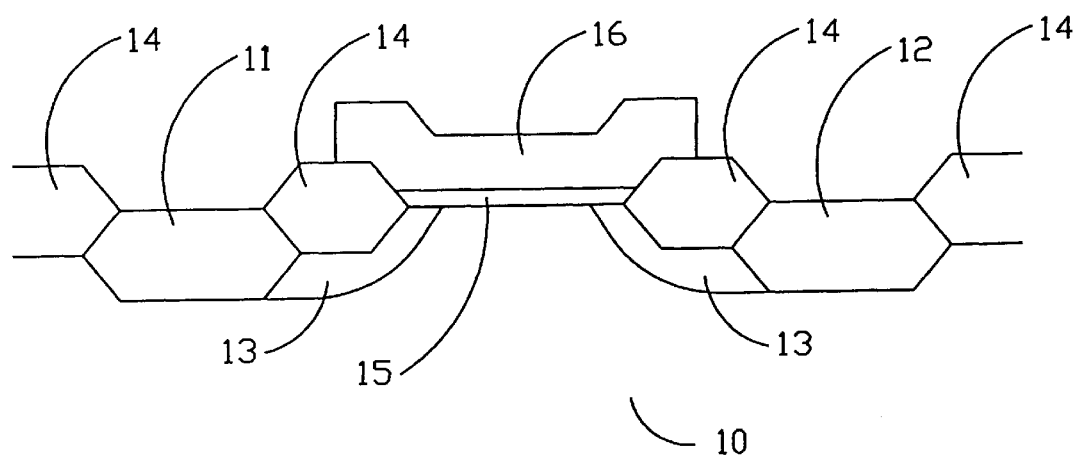
FIG. 1A is a cross-sectional view of a CMOS having a conventional source/drain region.
Figure 1B:
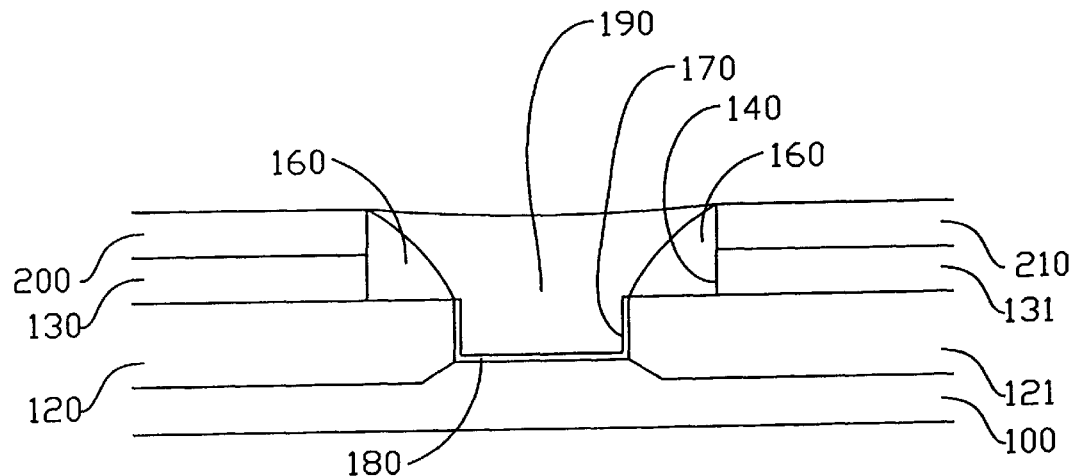
FIG. 1B shows a cross-sectional view of a preferred embodiment of the present invention.
Figure 2A:
FIG. 2A to FIG. 2K are cross-sectional views respectively illustrating a method for fabricating another preferred embodiment of the present invention.
Figure 2A:

A preferred embodiment of the present invention provides a method for forming of a high voltage complementary metal oxide semiconductor (HV-CMOS) with a gradient doping source/drain region. A method for fabricating the semiconductor device is illustrated in FIG. 2A to FIG. 2K. The first step is to provide a p-type conductivity semiconductor substrate 100, as shown in FIG. 2A.

Figure 2B:
Figure 2B:

FIG. 2B shows an optional inclusion of a p-type epitaxial (p-epi) semiconductor substrate 101 within the substrate 100, which function as a prevention for latch up to occur within CMOS devices. However, in order to simplify the structure of the present invention the p-epi semiconductor substrate 101 will not be included in the following device structures.

Figure 2C:
Figure 2C:

In FIG. 2C, forming a silicon oxide layer 110 on top of the substrate 100 by using Plasma Enhanced Chemical Vapor Deposition (PECVD). The thickness of the silicon oxide layer 110 is in between 900 angstroms and 3500 angstroms. The silicon oxide layer 110 can be formed by using any type of chemical vapor deposition, such as APCVD or LPCVD, and is not only restricted to formation through PECVD. This silicon oxide layer 110 acts as a mask for ion implantation or thermal diffusion, which protects the chip surface by reducing the sacrificial layer of the destruction caused by ion implantation.

Figure 2D:

In FIG. 2D, a well known photolithography technology is used to decide the exact locations of a first doping region (N-well 1) 120 and 121 of source/drain region. Then, using thermal diffusion to drive-in a first dopant, the conductivity type of the first dopant is opposite to the conductivity type of the substrate.

Figure 2E:
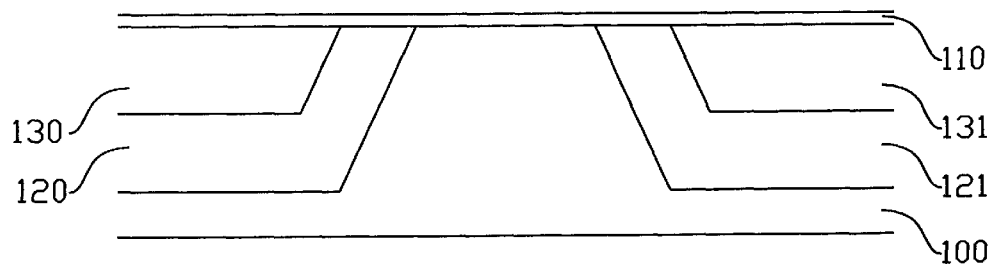

Sequentially, as shown in FIG. 2E, the same procedure is used for FIG. 2D to form a second doping region (N-well 2) 130 and 131 of source/drain region. The conductivity type of a second dopant is the same as the conductivity type of the first doping region. Moreover, the doping density of the second doping region is higher than the doping density of the first doping region.

Figure 2F:
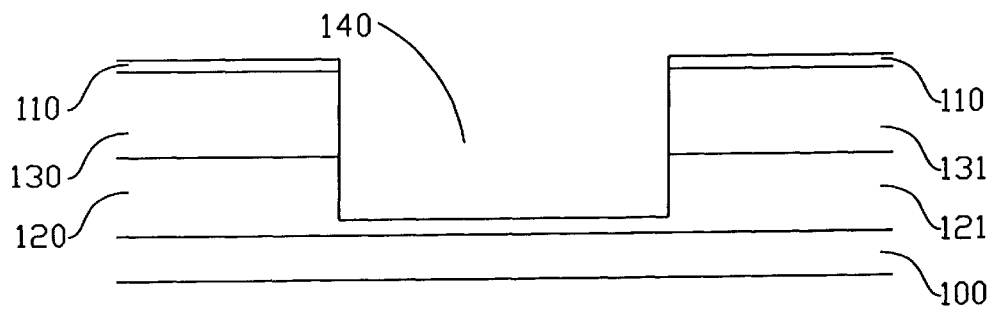

In FIG. 2F, a masking layer is formed and uses a trench isolation method to pattern out a first trench 140. The depth of the first trench is almost equivalent to the depth of N-well 1 but does not exceed this depth.

Figure 2G:
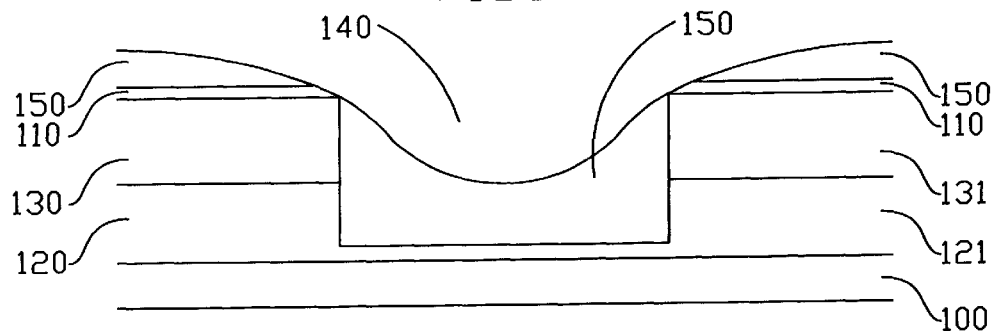

Next, as shown in FIG. 2G, a silicon oxide layer 150 or a silicon nitride layer is formed along an exposed surface of the resulting structure by using a conformal-type deposition method. The oxide layer covers the bottom surface and the sidewalls of the first trench 140 as well as the topmost surface of source/drain region. This oxide layer should not be formed by using any chemical vapor deposition method, otherwise the whole first trench 140 would be filled up and hence affect the contact area of a gate electrode in later stages. Therefore, structures with higher glutinous characteristic and lower mobility should be used.

Figure 2H:
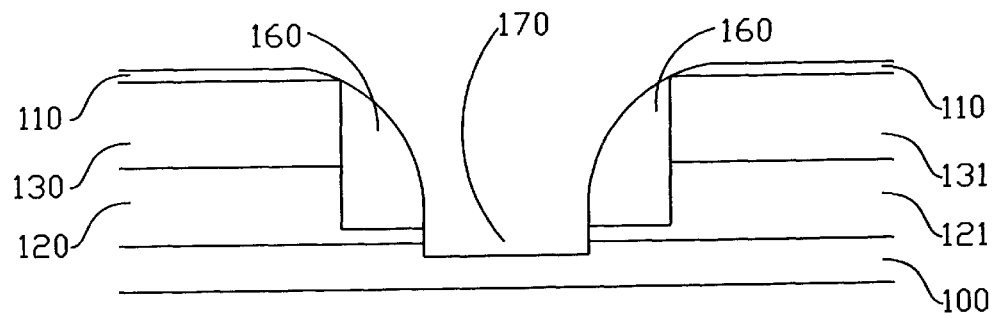

In FIG. 2H, etching back a portion of the silicon oxide layer that is on the top surface of the source/drain region to expose the surface of another silicon oxide layer 110 is undertaken. Subsequently, a masking layer is formed and the trench isolation method to pattern out a second trench 170 within the first trench and inside the substrate 100. The depth of the second trench 170 is deeper inside the substrate than the depth of the first trench and the width of the second trench is smaller than the width of the first trench. After the formation of said second trench 170, there is formed a spacer 160 on the sidewall and a portion of the bottom surface of the first trench. This spacer acts as an isolating layer and functions as a point of exertion for edges of a gate electrode.

Figure 2I:
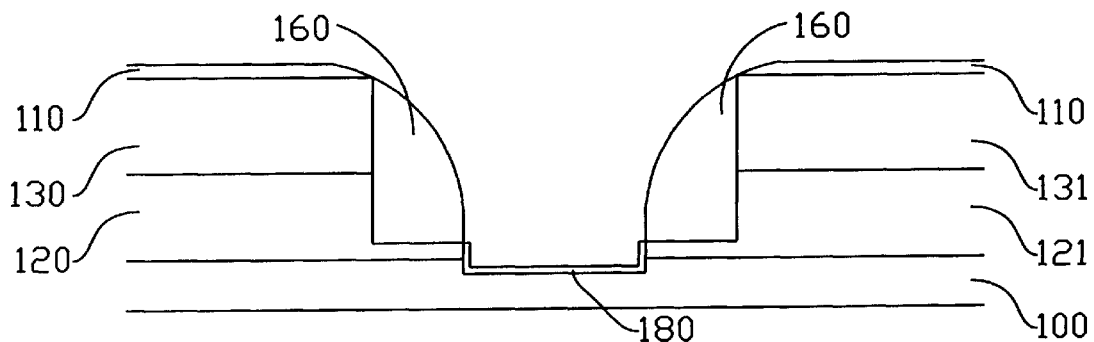

As shown in FIG. 2I, a gate oxide layer 180 is formed along the edge of the sidewalls and the bottom surface of the second trench.

Figure 2J:
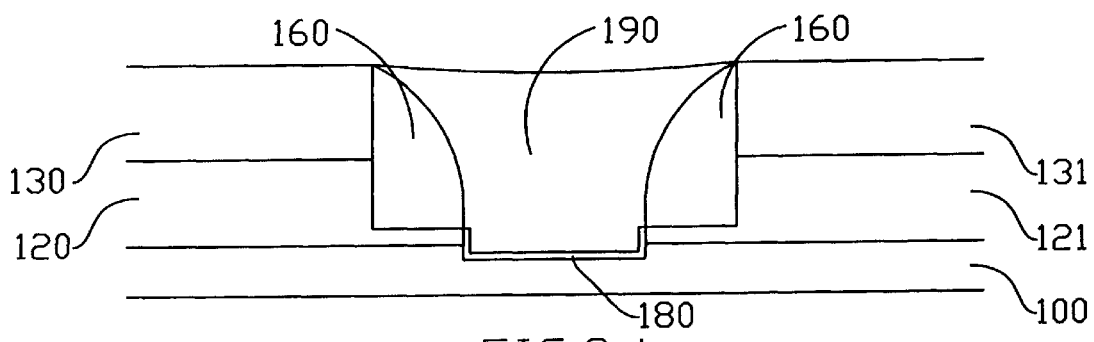

Subsequently, as shown in FIG. 2J, the silicon oxide layer 110, is removed shown in FIG. 2I, from the top of the source/drain region to expose the surface of N-well 2. Hereafter, LPCVD is used to form a $N^+$ type doped polysilicon layer and overlaying the entire exposed surface of the resulting structure as well as filling up the first trench and the second trench. Then, the polysilicon layer is etched back to form a buried gate electrode 190, wherein an exposed surface of the gate electrode 190 is almost equivalent in height as the exposed surface of N-well 2. 3 Furthermore, the buried gate electrode can also be formed by using a polysilicon compound or other metallic material.

Figure 2K:
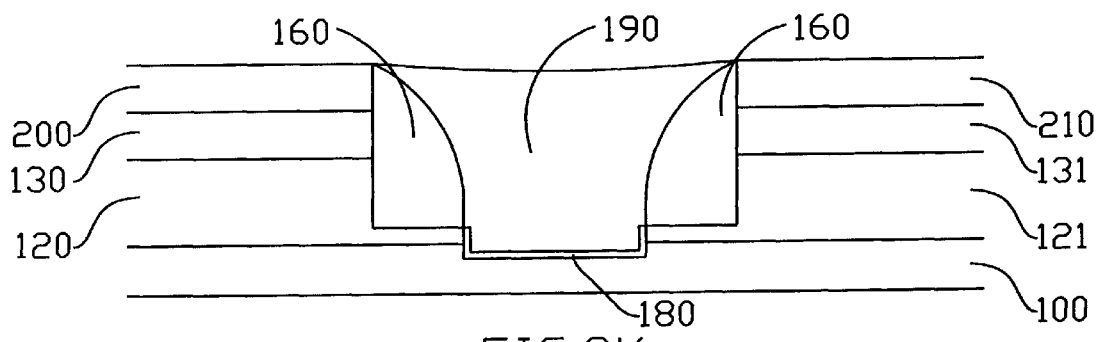

Finally, as shown in FIG. 2K, using thermal diffusion is used to drive-in ions with a third doping density and to form a third doping region inside said source/drain region. Herein, a $N^+$ type source electrode 200 and a $N^+$ type drain electrode 210 are formed. The top surface of the third doping region is also the uppermost surface of the source/drain region. The conductivity type of a third dopant is the same as the conductivity type of the second doping region, and, the doping density of the third doping region is higher than the doping density of the second doping region. FIG. 2K only represents a semiconductor structure of an embodiment of the present invention. This structure not only reduces in the occupied chip area, but also provides an enhancement in high current drive capability and as well as in breakdown voltage.

Figure 2L:
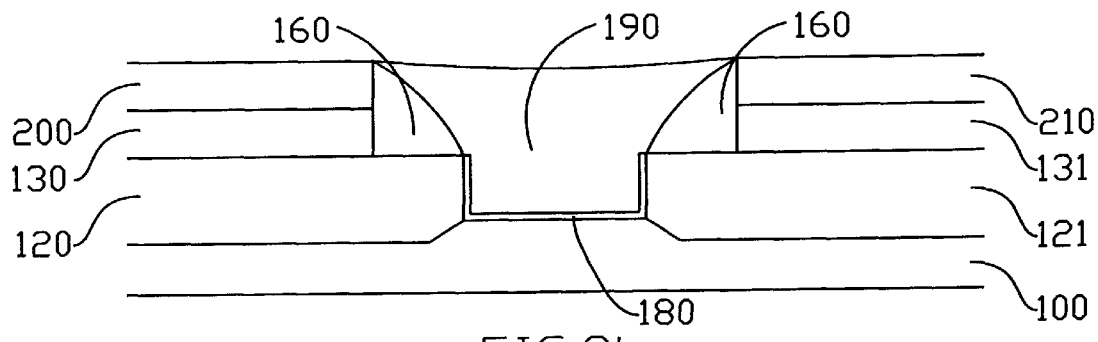
FIG. 2L is the same as FIG. 1B.

Another preferred embodiment of the present invention is shown in FIG. 2L, wherein the structure is very similar to the structure of the previous embodiment shown in FIG. 2K. There are some differences. Firstly, the depth of the first trench 140 is equal to the depth of the second doping region 130 and 131, where instead in FIG. 2K it is at a level slightly higher than the bottom of the first doping region 120 and 121. Secondly, the depth of the second trench is slightly above the bottom of the first doping region, where instead in FIG. 2K it is slightly below the bottom of the first doping region. As a result of these, both buried gate electrode 190 and spacer 160 occupy a smaller volume as compare to the previous embodiment shown in FIG. 2K.

In despite of the slight differences in those two structures shown in FIG. 2K and FIG. 2L of the preferred embodiment of the present invention, they perform exactly the same functions and having the same advantages.

Although specific embodiments have been illustrated and described, it will be obvious to those skilled in the art that various modifications may be made without departing from what is intended to be limited solely by the appended claims.

What is claimed is:

1. A high voltage semiconductor device, comprising:

a semiconductor substrate;

a first trench formed inside said substrate to a first depth;

a second trench formed inside said substrate to a second depth;

a pair of source and drain regions formed on the left side and right side of said first trench and said second trench respectively, moreover, said pair of source and drain regions being formed within said substrate and having a depth approximately equal to said second depth of said second trench;

a first doping region formed within said pair of source and drain regions, wherein the conductivity type of a first dopant is opposite the conductivity type of said substrate;

a second doping region formed within said pair of source and drain regions and positioned directly above said first doping region, wherein the conductivity type of a second dopant is the same as the conductivity type of said first doping region, moreover, the doping density of said second doping region is higher than the doping density of said first doping region;

a third doping region formed within said pair of source and drain regions and positioned directly above said second doping region, wherein the top surface of said third doping region is the uppermost surface of said pair of source and drain regions, the conductivity type of a third dopant being the same as the conductivity type of said second doping region, moreover, the doping density of said third doping region being higher than the doping density of said second doping region;

a spacer formed on sidewalls of said first trench and also occupies a bottom portion of said first trench;

a gate oxide layer formed on sidewalls and on a bottom surface of said second trench;

a buried gate electrode formed on top of said gate oxide layer and also fills up said first trench and said second trench, wherein the top surface of said buried gate electrode has a height almost equal to the uppermost surface of said pair of source and drain regions.

2. The high voltage semiconductor device as recited in claim 1, wherein said first depth of said first trench is equal to the depth of said second doping region or is at a level slightly higher than the bottom of said first doping region.

3. The high voltage semiconductor device as recited in claim 1, wherein said second depth of said second trench is either slightly above or slightly below the bottom of said first doping region.

4. The high voltage semiconductor device as recited in claim 1, wherein said second trench is deeper inside said substrate than said first trench, and the width of said second trench is smaller than the width of said first trench.

5. The high voltage semiconductor device as recited in claim 1, wherein said first and second doping region constitute a grading doping for a drift region.

6. The high voltage semiconductor device as recited in claim 1, wherein the shape of said gate oxide layer is a "U"-type shape and represents a channel length between said source region and said drain region.

7. The high voltage semiconductor device as recited in claim 1, wherein said spacer is formed within said substrate and functions as a point of exertion and also as an isolation layer.

8. The high voltage semiconductor device as recited in claim 7, wherein said spacer is located between said source/drain region and said buried gate electrode.

9. The high voltage semiconductor device as recited in claim 7, wherein said spacer comprises silicon oxide or silicon nitride.

10. The high voltage semiconductor device as recited in claim 1, wherein said semiconductor substrate comprises silicon.

11. The high voltage semiconductor device as recited in claim 1, wherein said semiconductor substrate has p-type conductivity.

12. The high voltage semiconductor device as recited in claim 1, wherein said buried gate electrode comprises polysilicon, polysilicon compound, or metal.

13. The high voltage semiconductor device as recited in claim 1, wherein said first, second, and third doping regions of said pair of source and drain regions comprises n-type doped semiconductor.

* * * * *